United States Patent [19]

Bumgardner

[11] 4,328,470
[45] May 4, 1982

[54] PULSE MODULATED IMPATT DIODE MODULATOR

[75] Inventor: Jon H. Bumgardner, Ridgecrest, Calif.

[73] Assignee: The United States of America as represented by the Secretary of the Navy, Washington, D.C.

[21] Appl. No.: 149,057

[22] Filed: May 12, 1980

[51] Int. Cl.³ .............................................. H03K 7/08
[52] U.S. Cl. .................................. 332/9 T; 307/106; 332/52; 332/59; 343/5 DD; 375/71
[58] Field of Search ................... 332/9 T, 31 T, 37 D, 332/59, 52; 331/107 R, 173; 375/22, 23, 71; 307/106, 265–268, 286, 287; 343/5 DD, 17.1 R, 17.1 PF, 17.1 PW

[56] References Cited

U.S. PATENT DOCUMENTS

| | | | |
|---|---|---|---|
| 3,612,914 | 10/1971 | Evans | 307/285 |
| 3,621,463 | 11/1971 | Olson, Jr. | 331/101 |
| 3,628,171 | 12/1971 | Kurokawa et al. | 331/56 |
| 3,705,364 | 12/1972 | Takeshima | 332/18 |
| 3,792,375 | 2/1974 | Brackett | 331/96 |
| 3,793,539 | 2/1974 | Clorfeine | 307/287 |
| 3,815,049 | 6/1974 | Beurrier | 331/107 R |
| 4,058,776 | 11/1977 | Allen, Jr. et al. | 330/299 |

OTHER PUBLICATIONS

Hosking, "Microwave Voice Link", Wireless World, vol. 83, Oct. 1977, pp. 49–52.
Tozer et al, "A High Speed, High Stability, Current Pulse Modulator for X Band IMPATT Diodes", Journal of Physics E, vol. 8, Sep. 1975, pp. 781–783.

Primary Examiner—Siegfried H. Grimm
Attorney, Agent, or Firm—Robert F. Beers; W. Thom Skeer

[57] ABSTRACT

A high efficiency modulator circuit for modulating a microwave oscillator having a negative resistance device comprising an IMPATT diode disposed within a resonant cavity is presented. A first transistor comprising a relatively high output impedance, fast transient response, low power dissipation, wideband current source modulates the power applied to the diode thereby reducing power dissipation and improving the power conversion efficiency of the modulator during operation. Current controlling and limiting means is provided in the emitter of the first transistor for controlling and limiting the current to the diode for improving the burn-out reliability thereof. A modulating signal is provided to the base of the first transistor by the emitter of a second transistor connected in a modified Darlington configuration for providing a high efficiency, wideband, low impedance source to the base of the first transistor improving the transient response thereof. Adjustable feedback is provided around the two transistors for tailoring the source impedance and characteristics of the modulator to the particular diode thereby further improving the power conversion efficiency, stability, and transient response of the modulator circuit.

10 Claims, 2 Drawing Figures

PULSE MODULATED IMPATT DIODE MODULATOR

BACKGROUND OF THE INVENTION

1. Field of the Invention

The present invention relates to a modulator circuit for modulating a microwave oscillator having a negative resistance device comprising an IMPATT diode, and more particularly, to a microwave modulator circuit wherein the power conversion efficiency and reliability of the IMPATT diode is substantially improved.

2. Description of the Prior Art

Microwave frequency oscillators are increasingly using high frequency negative dynamic resistance diodes of the type now generally known as IMPATT diodes which is an acronym for Impact Avalanche and Transient Time. These diodes are increasingly being used as a source of fairly high power microwave energy such as at frequencies in excess of (1) Giga-Hertz ($10^9$ cycles per second). An IMPATT diode is a semiconductor diode having a PN junction and a current transient region between opposite contacts. The IMPATT diode is generally mounted within a cavity resonator. When an applied direct current voltage exceeds the breakdown voltage of the diode, the diode is said to be in the avalanche breakdown region. Thus a slightly greater than breakdown voltage applied to the diode will cause a displacement current or electric field in the depletion layer of the diode's semiconductor material. Charge carriers are ionized at the point of maximum electric field within the depletion layer. The charge density is increased when the ionized carriers collide with other atoms and create more carriers forming a displacement current. The displacement current can also be considered as causing a wavefront, moving with a specific wave velocity provided that the magnitude of the current is sufficiently large. If the wavefront velocity associated with the displacement current is greater than the saturation velocity of the carriers, a high density of holes and electrons will be left in the wake of this wavefront. As a result of the concentration of holes and electrons, the electric field is then reduced and the velocity of the carriers is dimished leading to the formation of a dense plasma. Microwave energy is obtained from the avalanche diode by extraction of energy from the trapped plasma.

The RF voltages at the diode terminals give rise to the formation of concentrations of charge each of which travels across the transient region in the diode within the prescribed time period. The times for charge formation and transient through the diode are arranged with respect to the resonant frequency of an external resonator such that RF current that is 180° out of phase with the RF voltage at the diode terminals flows through the resonator. Consequently, with an appropriate external resonator, this component of current through the terminals increases as the terminal voltage decreases, thus meeting the condition of negative resistance. Ultimately, part of the DC energy applied to the diode is converted to RF energy and the resonator and the circuit constitutes an reliable solid state microwave source.

Because of the solid state reliability of the IMPATT diode the use of such a diode is particularly desirable where lightweight and solid state reliability are imperative, such as in the target seeking radar system of a guided missile, or the like. In such portable armament, it is highly desirable that in addition to the improved reliability of the solid state device, that the radar system operate as efficiently as possible to reduce heat sinking needs and power drain from a power supply of limited capacity. It has been found after a study of the available microwave oscillators currently available that the commercially available modulators for the IMPATT diodes have efficiencies of only about 50–75% with rise times of only 20 or more nano-seconds and considerable on-state modulator losses. Accordingly, it is desirable to provide a reliable highly efficient solid state modulator circuit for a microwave oscillator having greatly improved efficiency.

Two of the reasons for the poor efficiency of the prior art modulators are poor transient time of such modulators since the modulator will dissipate unnecessary power during the transient time of the modulating waveform and detrimental on-state power losses. For instance, at zero voltage across the modulator and a maximum current through the modulator, the power dissipation will be minimal, and at maximum voltage across the modulator with minimum current through the modulator, the power of dissipation will likewise be minimal. During the transient time between minimum voltage and maximum current switched state, and the maximum voltage and minimum current switched state, substantial voltage and current will simultaneously appear respectively across and through the modulator causing considerable power dissipation in the modulator. Accordingly, it is desirable to switch the IMPATT diode between the two switched states with minimum transient time and co-existing minimum modulator on-state power dissipation for providing highest efficiency.

SUMMARY OF THE INVENTION

Briefly, the present invention relates to a high efficiency modulator circuit for modulating a microwave oscillator having a negative resistance device comprising an IMPATT diode disposed within a resonant cavity. A switchable modulator device comprising a first transistor modulates the power applied from the power supply to the IMPATT diode by providing the power through the circuit means comprising a wideband current source having a relatively high output impedance with a fast transient response and low on-state power dissipation. A current limiter is provided in cooperation with the wideband current source first transistor for limiting and controlling the current providable to the diode for providing burn-out protection. An externally provided modulating signal is provided to the base of the first transistor through the emitter of a premodulator second transistor connected to the base of the first transistor in a modified Darlington configuration. In this manner, the first transistor modulator is fed from a high efficiency low impedance source thereby greatly improving the transient time of the first transistor by permitting minority carriers to be rapidly swept out from the base region during switching transients. Adjustable feedback is provided around the first and second transistors for tailoring the source impedance and characteristics of the modulator to the particular diode for further improving the power conversion efficiency, stability, and transient response of the modulator circuit.

OBJECTS OF THE INVENTION

With reference to the background of the invention hereinabove, accordingly, it is an object of the present invention to provide a high efficiency modulator circuit for a microwave oscillator.

Another object of the present invention is to provide a modulator circuit for modulating a microwave oscillator wherein the IMPATT diode is modulated by a wideband current source having a relatively high output impedance and fast transient response.

A further object of the present invention is to provide a modulator circuit for modulating a microwave oscillator wherein the current source providing modulation power to the IMPATT diode is provided with current controlling the limiting means for controlling and limiting current providable to the diode for protection against burn-out.

Still another object of the present invention is to provide a modulator circuit for modulating a microwave oscillator wherein the modulating signal is fed to the modulating transistor by a high efficiency low impedance source thereby improving the efficiency and transient time of the modulating transistor.

Yet another object of the present invention is to provide a modulator circuit for modulating a microwave oscillator wherein feedback means is provided for tailoring the characteristics of the modulator to the particular diode thereby further improving the power conversion efficiency, stability, and transient response of the modulator circuit.

Further objects and advantages of the present invention will become apparent as the following description proceeds and the features of novelty characterizing the invention will be pointed out with particularity in the claims annexed to and forming a part of the specification.

BRIEF DESCRIPTION OF THE DRAWINGS

For a better understanding of the present invention reference may be had to the accompanying drawings wherein.

DESCRIPTION OF THE PREFERRED EMBODIMENT

Figure 1:
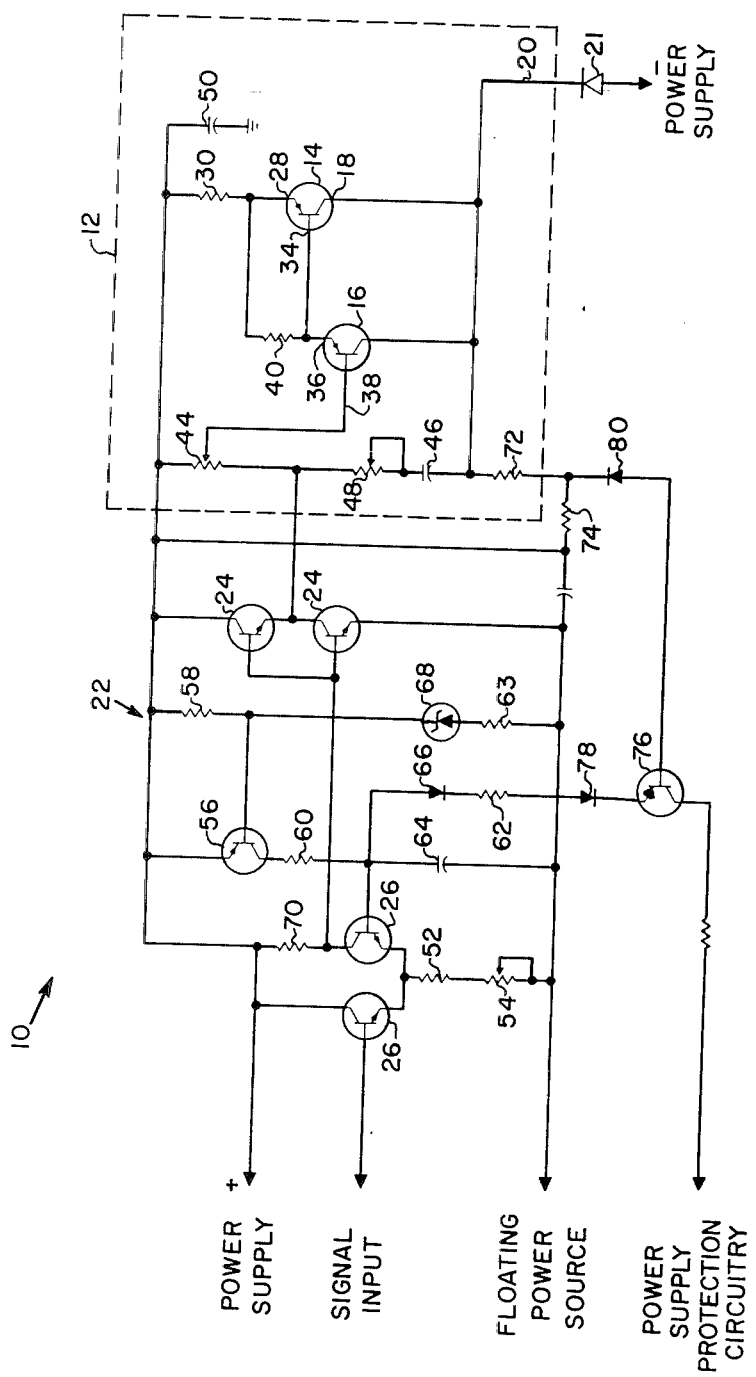
FIG. 1 is a schematic of a preferred embodiment of the present invention.

Referring now to the accompanying drawing wherein same reference numerals have been applied to like parts and wherein FIG. 1 shows a modulator circuit generally designated 10 which comprises a modulator stage 12 having a modulator transistor 14 and a driver or pre-modulator transistor 16. Collector 18 of transistor 14 is connected to lead 20 which is connected to one terminal of the IMPATT diode 21, the other terminal of the IMPATT diode 21 being connected to the negative terminal of a power supply (not shown). The modulation signal is applied to the driver transistor 16 through predriver stages generally designated 22 which comprises a push-pull amplifier 24 and differential amplifier 26.

More particularly, in the exemplary embodiment, the anode of the IMPATT diode is connected directly to the negative polarity of the power supply with the cathode being connected to the positive polarity of the power supply through the modulator stage 12. Modulator transistor 14 is a high frequency PNP transistor having the collector 18 connected directly to IMPATT diode 21 and providing power to the diode from the power supply. An emitter 28 of modulator transistor 14 is connected to the positive polarity of the power supply through a resistor network 30 which comprises a plurality of resistors connected in parallel. The modulator transistor 14 is a wideband high frequency transistor, in the exemplary embodiment being a 2N5162.

As is known to those skilled in the art with reference to the collector output current versus collector output voltage curves for a transistor with constant input current to the base, the collector output of a transistor is a current source having a very high output impedance essentially corresponding to the slope of the collector current versus collector voltage and providing a current source output. Typically, for the silicon transistor of the present embodiment, the output impedance of the transistor at the collector can be in the order of kilohms at the frequencies of interest.

A current source is used for driving the IMPATT diode to control the charge carriers in the depletion layer which are current sensitive. In this manner, the voltage across the IMPATT diode can vary thereby generating a microwave frequency output.

The resistor network 30 in the emitter of modulator transistor 14 provides a voltage drop between the positive terminal of the power supply and the emitter 28 caused essentially by the current flowing through the collector 18 to the IMPATT diode. This voltage drop across resistor 30 in addition to the base-emitter diode voltage drop of transistor 14 defines reference voltage at the base 34 of modulator transistor 14. Thus, the voltage externally applied to the base 34 defines the voltage across the resistor 30 and hence the current through the diode 21. In this manner, the current provided to the diode 21 by transistor 14 will be constant irrespective of voltage changes at the terminals of diode 21.

In the exemplary embodiment, the resistor network 30 comprises a plurality of individual resistors each of which is of an appropriately non-inductive type such as a bulk carbon or a deposited carbon resistor without spiral configuration about a core. Because such non-inductive resistors are economically available in low power ratings, a sufficient plurality of resistors are connected in parallel to achieve the necessary power rating.

Thus as explained above, the current available to the diode is limited for protecting the diode against burn out failures and the diode is powered from a controlled constant current of high impedance source for maintaining the required constant controlled current in the diode regardless of the voltage present to the terminals of the diode.

It is within the contemplation of the present invention that the current limiter can be a controllable solid state device, with or without a control gate or base for controlling and limiting the amplitude of the diode current or the waveshape of the diode current with respect to time.

Driver transistor 16 is connected with its emitter 36 being directly connected to the base 34 with transistor 16 and transistor 14 being connected in modified Darlington configuration. In this manner, the emitter follower output of transistor 16 presents a low impedance signal source to the base 34 of transistor 14 and performs impedance transformation between the higher impedance present at the base 38 of transistor 16 down to a low impedance presented at base 34. A resistor 40 is connected between the base 34 and the emitter 28 and greatly lowers the source impedance to the base 34 during both turn-on and turn-off transient times and further greatly improves the transient time of transistor 14. In this manner, i.e. a low impedance source feeding transistor 14, minority carriers are more rapidly swept out of the base region particularly during the decay time of the switching waveform thereby further improving the transient response of transistor 14. The collector of transistor 16 is connected to the lead 20 and provides additional drive for the IMPATT diode.

Base 38 of transistor 16 is connected to potentiometer 44 for adjusting the signal level to the modulator stage 12. It has been found contrary to prior art teachings, that the optimum source impedance for modulating the IMPATT diode is not necessarily the highest impedance obtainable by a current source. Feedback capacitor 46 and feedback potentiometer 48 provide adjustable feedback around modulator stage 12 comprising tansistors 14 and 16 for reducing and controlling the output impedance of collector 18 for tailoring the output impedance of the modulator stage 12 to the particular IMPATT diode. In the exemplary embodiment, capacitor 46 is 62 pf and potentiometer 48 is 500 ohms.

It is within the contemplation of the present invention that modulating devices other than bipolar transistors disclosed can be used. It is further within the contemplation of the present invention that other forms of negative feedback can be utilized.

Capacitor 50 serves as an AC bypass from the power supply to short out any internal impedance of the power supply at the frequencies of interest.

The modulation signal fed to the base 38 through potentiometer 44 is provided by the predriver stages 22. Push-pull amplifier 24 feeds the modulation signal to potentiometer 44 and in turn receives signals from differential amplifier 26 having common mode emitter resistors 52 and 54 and a base biasing current source comprising transistor 56, resistors 58, 60, 62, and 63, bypass capacitor 64, diode 66, and zener diode 68 connected between the positive terminal of the power supply and a floating power source which is a predetermined voltage (i.e., 15 volts) below the positive power supply terminal voltage. Additionally, the base biasing circuitry provides temperature compensation for the modulator circuit 10 in which all stages are direct coupled.

Resistor 70 is the load for differential amplifier 26 which feeds push-pull amplifier 24. Differential amplifier 26 receives the input modulating signal supplied from an external source. Resistors 72 and 74 connect modulator 12 to the floating power source and serve as voltage sensing resistors for transistor 76 and diodes 78 and 80 which protect the modulator against diode 21 failures. If the voltage across the modulator stage 12 becomes too large, a control signal is provided by transistor 76 which is connected to a crowbar power supply protection circuit (not shown) to protect the modulator against excessive voltage in a manner well known in the art.

Figure 2:
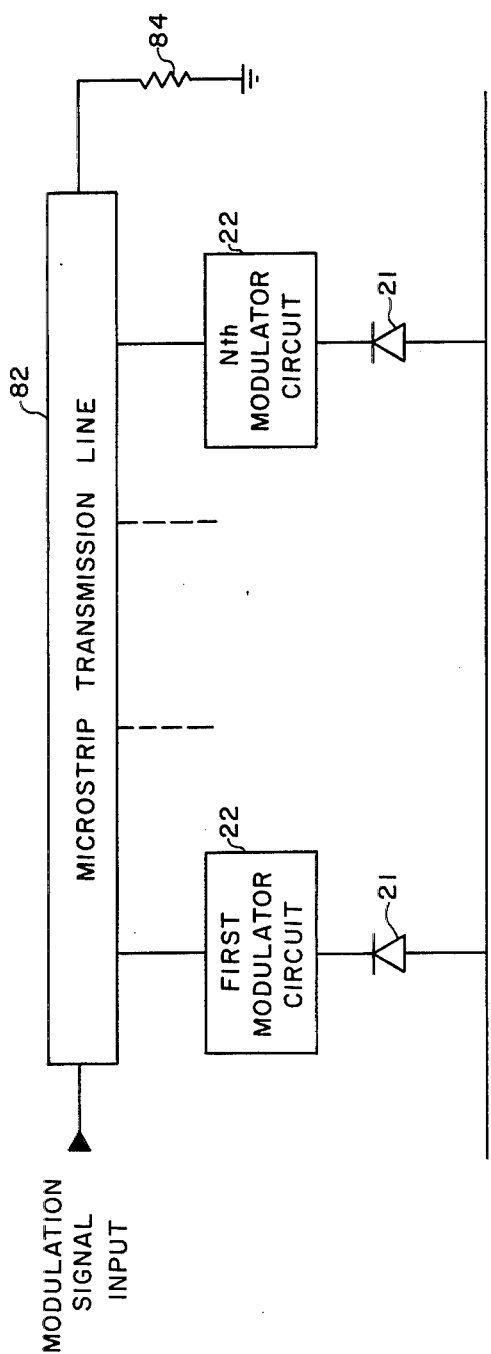
FIG. 2 shows a plurality of modulator circuits of FIG. 1 commonly supplied with a modulating signal by a microstrip transmission line.

Referring now to FIG. 2, in order to provide the high power necessary for some radar applications, the plurality of IMPATT diodes 21, each modulated by a circuit 10, can be operated in parallel for adding the output power of the respective IMPATT diodes. In such a case, it is necessary that an input signal be applied to each of the modulator circuits 10 in the correct phase and time. In the present embodiment the input signal is coupled to the respective modulator circuits via a microstrip transmission line 82 terminated by impedance 84 which in the present embodiment is a 33 ohm load.

Thus, there is disclosed a high efficiency modulator circuit for modulating a microwave oscillator having a negative resistance device comprising an IMPATT diode disposed within a resonant cavity. A first transistor comprising a relatively high output impedance, fast transient response, low power dissipation, wideband current source modulates the power applied to the diode thereby reducing power dissipation and improving efficiency of the modulator during operation. Current controlling and limiting means is provided in the emitter of the first transistor for controlling and limiting the current to the diode for improving the burn-out reliability thereof. A modulating signal is provided to the base of the first transistor by the emitter of the second transistor connected in a modified Darlington configuration for providing a high efficiency wideband low impedance source to the base of the first transistor thereby improving the transient response thereof. Adjustable feedback is provided around the two transistors for tailoring the source impedance and characteristics of the modulator to the particular diode thereby further improving the power conversion efficiency, stability, and transient response of the modulator circuit. The modulator circuit receives the modulating signal from a predriver circuit comprised of a push-pull amplifier and a differential amplifier. Voltage across the modulator circuit is sensed and when such voltage exceeds a predetermined value, a crowbar protection circuit is actuated for protecting the modulator against such excessive voltage.

While it has been illustrated and described what is at present considered to be a preferred embodiment of the present invention, it will be appreciated that numerous changes and modifications are likely to occur to those skilled in the art and it is intended in the appended claims to cover all those changes and modifications which fall within the true spirit and scope of the present invention.

What is claimed as new and desired to be secured by Letters Patent is:

1. A modulator circuit for modulating a microwave oscillator having a negative resistance device which derives power from a power supply, the modulator circuit being controlled by a modulator signal fed from a signal source and comprising:

a switchable device having an input, an output and a gate lead, the output providing a current source of predetermined output impedance connected to the negative resistance device for providing power thereto, the switchable device having a switchable conductive state and a switchable open state as controlled by signal fed to the gate lead;

feedback means connected to the output for changing the predetermined output impedance for matching characteristics of the negative resistance device;

current controlling the limiting means connected to the input for limiting current provided by the current source to the negative resistance device when the switchable device is in the conductive state; and circuit means connected to the gate for controlling the switchable states of the switchable device and providing impedance transformation between the gate and the signal source.

2. A modulator circuit for modulating a microwave oscillator having a IMPATT diode which derives power from a power supply, the modulator circuit being controlled by a modulation signal fed from a signal source and comprising:
   a first transistor having an input emitter, an output collector and a base gate lead, the output providing a current source of predetermined output impedance connected to the IMPATT diode for providing power thereto, the first transistor having a switchable conductive state and a switchable open state as controlled by signal fed to the gate lead;
   current controlling and limiting means connected to the input for limiting current provided by the current source to the IMPATT diode when the first transistor is in the conductive state; and
   circuit means comprising a second transistor having an emitter connected to the base gate of said first transistor and having a collector connectable to the power supply and a base connected to the signal source, said first and second transistors being connected in a Darlington configuration for controlling the switchable states of the first transistor and providing impedance transformation between the base gate of said first transistor and the signal source.

3. The modulator circuit of claims 1 or 2 wherein the signal source further comprises a drive circuit comprising a push-pull amplifier and a differential amplifier fed into the input of the drive circuit, the output of the drive circuit being fed to the circuit means.

4. The modulator circuit of claims 1 or 2 further comprising protection means for sensing a power fault in the circuit and means for inhibiting power drain from the power supply by the modulator circuit upon occurrence of the power fault.

5. The modulator circuit of claim 1 wherein a plurality of modulator circuits are connected one each to a negative resistance device and a microstrip transmission line terminated by a predetermined impedance connects the inputs of the plurality of modulator circuits for feeding the signal thereto.

6. The modulator circuit of claim 2 wherein a plurality of modulator circuits are connected one each to an IMPATT diode and a microstrip transmission line terminated by a predetermined impedance connects the inputs of the plurality of modulator circuits for feeding the signal thereto.

7. A modulator circuit for modulating a microwave oscillator having a negative resistance device and connectable to a power supply having a first and second polarity output, the negative resistance device having a first lead connectable to the first polarity output, and a second lead connectable to the second polarity output by the modulator circuit so that power to the negative resistance device is controlled by the modulator circuit, the modulator circuit being controlled by an externally provided modulation signal and comprising:
   a first transistor having a first emitter, a first base, and a first collector, the collector being connected to the second lead of the negative resistance device, the emitter being connectable to the second polarity output of the power supply through a current limiting means, the base being adapted for receiving the modulation signal, the collector output comprising a current source having a predetermined output impedance for powering the negative resistance device;
   the current limiting means providing for limiting the maximum current providable by the current source to the negative resistance device;
   a second transistor having a second emitter, a second base and a second collector, the second collector being connectable to a power source, the second emitter being connectable to the second polarity output of the power supply and connected to the first base, the second base being adapted for receiving the modulation signal; and
   feedback means connected between the first collector and the second base for providing feedback around the first and second transistors and for changing the output impedance of the current source.

8. The modulator circuit of claim 7 wherein the feedback means is adjustable.

9. The modulator circuit of claim 7 wherein the feedback means comprises negative feedback for reducing the output impedance of the current source.

10. The modulator circuit of claim 7 further comprising a signal source for providing the modulation signal to the second transistor, the signal source comprising:
   a push-pull amplifier having a first pair of transistors and having an input and an output, and a differential amplifier having a second pair of transistors and having an input and an output, the input of the differential amplifier being adapted for receiving the externally applied modulation signal, the output of the differential amplifier being fed to the input of the push-pull amplifier, the output of the push-pull amplifier being fed to the base of the second transistor.

* * * * *